United States Patent [19]

Iio et al.

[11] Patent Number: 4,840,853
[45] Date of Patent: Jun. 20, 1989

[54] SURFACE STRUCTURE OF ALN SUBSTRATE AND A PROCESS FOR PRODUCING THE SAME

[75] Inventors: Satoshi Iio; Akiyasu Okuno, both of Nagoya, Japan

[73] Assignee: NGK Spark Plug Co., Ltd., Nagoya, Japan

[21] Appl. No.: 30,253

[22] Filed: Mar. 9, 1987

[30] Foreign Application Priority Data

Mar. 8, 1986 [JP] Japan ................................. 61-51213

[51] Int. Cl.$^4$ .............................................. B32B 15/04
[52] U.S. Cl. .................................... 428/698; 428/699; 428/704; 428/472
[58] Field of Search ............... 428/698, 699, 701, 901, 428/457, 704, 472

[56] References Cited

U.S. PATENT DOCUMENTS

| 4,540,673 | 9/1985 | Takeda et al. | 428/698 X |
|---|---|---|---|
| 4,578,232 | 3/1986 | Huseby et al. | 428/698 X |
| 4,591,537 | 5/1986 | Aldinger et al. | 428/698 |
| 4,600,658 | 7/1986 | Anderson et al. | 428/901 X |
| 4,659,611 | 4/1987 | Iwase et al. | 428/698 X |
| 4,695,517 | 9/1987 | Okuno et al. | 428/699 X |

FOREIGN PATENT DOCUMENTS 0129775  7/1984  Japan .

*Primary Examiner*—Nancy A. B. Swisher

[57] ABSTRACT

A surface structure of AlN substrate comprising:
an AlN substrate,
an intermediate layer disposed on the AlN substrate, and
a metallized layer disposed on said intermediate layer, said intermediate layer comprising at least aluminum, nitrogen and oxygen. The metallized layer has a main component of one of Mo-Mn alloy, MO and W, and has a thickness of 1-20 $\mu$m.

This surface structure is produced by coating a surface of AlN substrate with metallizing layer components, heat treating the resultant coated substrate at a temperature of 200°-500° C. under an oxidizing atmosphere, and further heating the heat treated coated substrate at a temperature of 1200°-1400° C. under a nonoxidizing atmosphere having a dew point of −35° to 5° C.

10 Claims, No Drawings

SURFACE STRUCTURE OF ALN SUBSTRATE AND A PROCESS FOR PRODUCING THE SAME

BACKGROUND OF THE INVENTION

The present invention relates to metallization of aluminum nitride sintered body for use as an insulating material having a high terminal conductivity in an insulating substrate, heat sink, laser tube, and the like.

In recent years, the requirements for minimizing electronic instruments and improving their functions have increased prominently. As a result, semiconductors are rapidly developing towards improvements in integration density, multifunctionationisation, high speed, high output, and high responsibility, wherein more and more heat is generated by the semiconductor. Therefore, a base plate or substrate with higher heat-dissipation (or radiation) ability is needed instead of conventional $Al_2O_3$ base plates or substrates. Various heat engines, industrial instruments, and the like are developing towards high output, too. Accordingly materials with higher heat-dissipation are generally required nowadays.

As the materials for substrates with high-dissipation ability, i.e., as the materials with high thermal conductivity, there are counted, for example, diamond, cubic BN (boron nitride), SiC (silicon carbide), BeO (beryllia), AlN (aluminum nitride), Si, and the like. However, there materials have following drawbacks. Diamond and cubic BN have a difficulty in manufacturing a product of such a size usable as a substrate and are very expensive. SiC cannot be used as an insulating material since SiC is semiconductive and inferior in electric characteristics such as electric insulating ability, dielectric constant, and the like. BeO, in spite of its excellent electric characteristics has a difficulty in its stable supply since it is not manufactured in Japan thus depends on the import from foreign countries, due to the poisonous powder occurring in the compacting process, abrasive machining process, and the like. Si has inferior electric characteristics and a low mechanical strength, and hence has a limited use as a material for the substrate. Although AlN has advantages that it is excellent in electric characteristics, for example, high insulating ability, high dielectric brake down strength, low dielectric constant, etc. and that it can be treated with a normal sintering, it has a drawback that the metal layer cannot be formed on a required surface and that a bonding strength to metal is insufficient because AlN has a low wettability to metal. Thus employing AlN, therefore, multilayer substrates for high output, laser tubes, and the like have never been developed.

SUMMARY OF THE DISCLOSURE

It is a primary object of the present invention to solve the problems described bove. Other objects will become apparent in the entire disclosure. For this object the following means is employed in the present invention.

That is, according to the first aspect of the present invention there is provided:

a surface structure of an AlN substrate comprising:
an AlN substrate,
an intermediate layer disposed on the AlN substrate, and
a metallized layer disposed on said intermediate layer, said intermediate layer comprising at least aluminum, nitrogen and oxygen.

According to the second aspect of the present invention there is provided:

a process for producing a surface structure of an AlN substrate characterized in:

coating a surface of the AlN substrate with metallizing layer components, heat treating the resultant coated substrate at a temperature of 200°–500° C. under an oxidizing atmosphere, and further heating the heat treated coated substrate at a temperature of 1200°–1400° C. under a nonoxidizing atmosphere having a dew point of −35° to 5° C.

Said AlN substrate may involve either only AlN or sintering aid normally used such as oxides of rare earth metals (e.g., yttria), oxides of alkali earth metals (e.g., calcia), and the like for the purpoe of improvement on the sintering properties or sinterability so on.

The first aspect of the present invention will be explained in what follows.

Said metallized layer preferably contains any of Mo—Mn alloy, Mo, and W as the main component. The Mo—Mn alloy may have a Mo/Mn ratio of at least 4 by weight, preferably at least 8 by weight.

Said intermediate layer should contain aluminum, nitrogen, and oxygen. Without nitrogen, for instance, being a component or these, the adhesion between this intermediate layer and the AlN substrate becomes insufficient. Without oxygen, the wettability between this intermediate layer and the metallized layer becomes low resulting in insufficient adhesion. Preferably, Al is present 40 wt % or more, N is present 1 wt % or more and oxygen is present 0.1 wt % or more in the intermediate layer. More preferred are 50–70 wt % for Al, 10–30 wt % for N and 1–30 wt % for oxygen.

Thickness of this intermediate layer is preferably more than 1 μm for high airtightness and bonding strength between this layer and the AlN substrate. Furthermore, thickness of this intermediate layer is preferably less than 20 μm for high thermal conductivity between this layer and the AlN substrate. Especially, thickness of the intermediate layer is more preferably 3–10 μm for both high adhesion strength and thermal conductivity. In addition, the intermediate layer may contain components in said metallized layer, e.g., Mn, Si, and the like except aluminum, nitrogen, and oxygen.

The second aspect of the present invention is explained in what follows.

Said metallized layer preferably contains any of Mo—Mn alloy, Mo, and W as the main component with at least 70 wt % (preferably 70–97 wt %), the balance being additional component(s). Furthermore, in addition to said components, this layer more preferably contains at least one additional component selected from the group consisting of Mg, Ca, Sr, Ba, Y, Ti, Zr, V, Cr, Nb, Mo, Mn, B, Al, Si, La, Hf, Ta, and oxides and nitride of these elements provided that one of which is preferably oxide as an active component. The active component(s) may preferably amount to 3–30 wt % (more preferably at least 3 wt % oxide) of the metallized layer components, and may be at least one of oxides such as $SiO_2$, MgO, CaO, MnO, $Y_2O_3$, $Nb_2O_5$, BaO and $Ta_2O_5$ (more preferably $SiO_2$, CaO, MnO, $Nb_2O_5$, BaO and $Ta_2O_5$).

Heat treating at a temperature of 200°–500° C. under an oxidizing atmosphere is a preliminary one of the heat treating under a nonoxidizing atmosphere mentioned later and promotes the reaction under the nonoxidizing atmosphere. A temperature lower than 200° C. causes insufficient promotion effect for the reaction resulting in dissatisfactory reaction under the nonoxidizing atmosphere. A temperature higher than 500° C. causes oxidation of the components in said metallized layer resulting in insufficient adhesion strength. Preferable temperature for the preliminary heat treating is in the range of 300°–400° C.

The dew point of the atmosphere lower than $-35°$ C. in the heat treating at a temperature of 1200°–1400° C. under a nonoxidizing atmosphere causes the supply of oxygen from only the component of the metallized layer to the formed layer by the reaction because of little amount of water in the atmosphere supplying oxygen, resulting in unfavorable compounds formed by reaction of Mo, W, and the like in the metallized layer and said active components, for instance, $Mo_3Si$ is formed by reaction of Mo and $SiO_2$ when $SiO_2$ is used as an active component. On the other hand, said dew point higher than 5° C. causes drastic oxidation of the AlN substrate, which spoils the characteristics inherent in AlN. Preferred dew point ranges from $-20°$ C. to 0° C.

Furthermore, said temperature lower than 1200° C. cannot produce sufficient reaction, resulting in insufficient adhesion between the AlN substrate and the metallized layer in the surface structure of the AlN substrate produced. On the contrary, said temperature higher than 1400° C. causes insufficient adhesion between the AlN substrate and the metallized layer in the surface structure of the AlN substrate produced since the components of the intermediate layer formed by said reaction only contain oxides, that is, lacking in nitrogen. Also, good metallized layer cannot be formed due to the starting of evaporation of the component in the metallized layer under such condition. A temperature range of 1250°–1350° C. is preferred.

Furthermore, surface roughness of the AlN substrate no more than 1.5 μm Ra results in stronger bonding.

The surface structure of AlN substrate according to the first aspect of the present invention has made strong bonding between the metallized layer and the AlN substrate possible by the existence of the intermediate layer containing at least aluminum, nitrogen, and oxygen between the metallized layer and the AlN substrate. Hence it has become possible to apply AlN substrate with excellent thermal conductivity and electric characteristics, which are difficult to be attained conventionally, to electronic instruments and parts of various industrial instruments.

The process for producing a surface structure of AlN substrate according to the second aspect of the present invention has made the process for producing the surface structure of AlN with said excellent properties according to the first aspect of the present invention possible by sintering the AlN substrate coated with components of the metallized layer in two stages of the heat treating, that is, at a temperature of 200°–500° C. under an oxidizing atmosphere and at a temperature of 1200°–1400° C. under a nonoxidizing atmosphere having a dew point of $-35°$ to 5° C.

DETAILED DESCRIPTION OF THE PREFERRED EMBODIMENTS

The present invention will be described with reference to embodiments thereof.

Example 1

In this example samples were made of planar AlN substrate having an average particle size of 10 μm and surface roughness of 0.7 μmRa coated with plate-like components of the metallized layer of about 20 μm thickness containing 80 wt% Mo, 10 wt% Mn, and 10 wt% $SiO_2$, followed by drying, heat treating under air at a temperature of 300° C. for an hour, and sintering at a temperature of 1300° C. under decomposed ammonia gas having a dew point listed in Table 1.

Thickness of the metallized layer (μm), components forming the metallized layer, thickness of the intermediate layer (μm), components forming the intermediate layer, heat-resistant test, and peeling strength (kgf/mm$^2$) of said sample were measured by methods described in the following. The results of the measurements are shown in Table 1.

Thickness of the metallized layer: This was measured on a cleaved surface of said sample using scanning electron microscope (JEOL JSM840).

Components forming the metallized layer: These were found by x-ray diffraction on the metallized layer of said sample. (Note, the X-ray microprobe analysis employed can detect at least 0.1 wt % oxygen and at least 1 wt % N.)

Thickness of the intermediate layer and components forming the intermediate layer: These were measured for cleaved surface of said sample using scanning electron microscope (JEOL JSM840) and X ray microprobe analysis (JEOL JXA733).

Heat-resistant test: The metallized layer of said sample was electroplated by Ni to form a Ni layer of 2–5 μm thickness followed by heating at a temperature of 850° C. for 10 minutes, repeated electroplating by Au, heating under air at a temperature for 450° C. for 5 minutes, and cooling down on a steel plate. Then, scaling off (detachment) of said electroplating layers was examined. The observed results are listed in the Table by marking nonscaled-off and scaled-off samples by O or X, respectively.

Peeling strength: The metallized layer of said sample was electroplated by Ni to form a Ni layer of 2–5 μm thickness followed by heating at a temperature of 850° C. for 10 minutes and soldering of Kovar (Ni alloy containing Co and Fe) plate of 1×1 mm using eutectic silver solder at a temperature of 930° C. for 5 minutes. A lead wire bonded to said Kovar plate was pulled to the direction perpendicular to the bonded surface at a velocity of 0.5 mm/sec and the peeling strength defined by the strength at which said Kovar plate is peeled from the AlN substrate.

What follows has become clear from Table 1.

(1) Dew point lower than $-35°$ C. such as the sample No. A-1 result in inferior heat resistance and peeling strength due to the formation of unfavorable compound like $Mo_3Si$ from the components in the metallized layer.

(2) Dew point higher than 5° C. such as the same Nos. A-6 and 7 results in inferior heat resistance and peeling strength due to lack of nitrogen in the intermediate layer.

Incidentially, Mn and $SiO_2$ in the metallized layer seems to amorphous structure since they were not detected by the X-ray diffraction.

TABLE 1

| Sample No. | Dew point | Metallized layer Thickness | Metallized layer Component | Intermediate layer Thickness | Intermediate layer Component | Heat-resistant test | Peeling strength |
|---|---|---|---|---|---|---|---|
| A-1 | −40 | <5 | Mo + Mo$_3$Si | 2 | Al, Si, O, Mn, N | X | 0.4 |
| A-2 | −30 | 7 | Mo | 3 | Al, Si, O, Mn, N | O | 1.5 |
| A-3 | −20 | 11 | Mo | 5 | Al, Si, O, Mn, N | O | 1.8 |
| A-4 | −10 | 13 | Mo | 6 | Al, Si, O, Mn, N | O | 2.3 |
| A-5 | 0 | 16 | Mo | 13 | Al, Si, O, Mn, N | O | 2.0 |
| A-6 | 10 | 18 | Mo | 16 | Al, Si, O, Mn | X | 0.9 |
| A-7 | 20 | 18 | Mo | 21 | Al, Si, O, Mn | X | 0.5 |

Notes: Unit of thickness of the metallized layer and the intermediate layer is μm. Peeling strength is indicated in kgf/mm$^2$.

TABLE 2

| Sample No. | Temperature | Metallized layer Thickness | Metallized layer Component | Intermediate layer Thickness | Intermediate layer Component | Heat-resistant test | Peeling strength |
|---|---|---|---|---|---|---|---|
| B-1 | 1150 | 19 | Mo | <1 |  | X | 0.5 |
| B-2 | 1200 | 16 | Mo | 3 | Al, Si, O, Mn, N | O | 1.5 |
| B-3 | 1250 | 13 | Mo | 5 | Al, Si, O, Mn, N | O | 1.7 |
| B-4 | 1300 | 11 | Mo | 5 | Al, Si, O, Mn, N | O | 1.8 |
| B-5 | 1350 | 7 | Mo | 6 | Al, Si, O, Mn, N | O | 2.1 |
| B-6 | 1400 | 4 | Mo | 7 | Al, Si, O, Mn, N | O | 1.6 |
| B-7 | 1450 | <3 | Mo | 9 | Al, Si, O, Mn, N | X | 0.3 |

Notes: Unit of thickness of the metallized layer and the intermediate is μm. Peeling strength is indicated in kgf/mm$^2$.

Example 2

In this example samples were made by a method similar to that in Example 1 except sintering at a temperature shown in Table 2 under decomposed ammonia gas having a dew point of −20° C.

Thickness of the metallized layer (μm), components forming the metallized layer, thickness of the intermediate layer (μm), components forming the intermediate layer, heat-resistant test, and peeling strength (kgf/mm$^2$) of said sample were measured by methods similar to those employed in Example 1. The results of the measurements are shown in Table 2.

(3) Heat treating temperature lower than 1200° C. under a nonoxidizing atmosphere as in the sample No. B-1 causes insufficient reaction between the metallized layer and the AlN substrate resulting in thickness of the intermediate layer less than 1 μm and, hence, inferior heat resistance and peeling strength.

(4) Heat treating temperature higher than 1400° C. under a nonoxidizing atmosphere such as the sample No. B-7 makes the components of the intermediate layer, formed between the metallized layer and the AlN substrate, only oxides. Hence this results in inferior heat resistance and peeling strength. Moreover, satisfactory metallized layer cannot be formed because of the starting of evaporation of the components of the metallized layer.

Example 3

In this example a sample was made by a method similar to that in Example 1 except coating of a planar AlN substrate with paste-like components of the metallized layer of about 20 μm thickness containing SiO$_2$ as an active component as shown in Table 3. Here in Mo—Mn component of the metallized layer in Table 3, weight ratio of Mn:Mn is 8:1 and the ratio of Mo—Mn and SiO$_2$ is indicated in wt %.

Thickness of the intermediate layer (μm), heat-resistant test, and peeling strength (kgf/mm$^2$) of said sample were measured by methods similar to those employed in Example. 1. Sheet resistance of the metallized layer formed was measured by the method described in the following. The results of the measurements are shown in Table 3.

Sheet resistance: Electric resistance of the pattern of the metallized layer formed having a width of 1 mm and a length of 30 mm was measured by the four-probe method and evaluated based on the following formula.

Sheet resistance $\rho' = R \cdot W/L$ where:

R: electric resistance measured by the four-probe method (mΩ)

W: pattern width of said metallized layer (mm)

L: pattern length of said metallized layer (mm)

What follows has become clear from Table 3.

(5) The active component (SiO$_2$) of the metallized layer of 3–30 wt % as in the sample Nos. C-2 to 5 results in excellent peeling strength and heat resistance as well as surface structure with excellent electric conductivity of the metallized layer.

TABLE 3

| Sample No. | Components of the metallized layer | | | Intermediate layer Thickness | Heat-resistant test | Peeling strength |
| --- | --- | --- | --- | --- | --- | --- |
| | Mo—Mn | SiO$_2$ | Electrical resistance | | | |
| C-1 | 98 | 2 | 15 | 2 | X | 0.5 |
| C-2 | 97 | 3 | 27 | 4 | O | 1.3 |
| C-3 | 90 | 10 | 40 | 5 | O | 1.8 |
| C-4 | 80 | 20 | 43 | 7 | O | 2.3 |
| C-5 | 70 | 30 | 50 | 10 | O | 2.8 |
| C-6 | 60 | 40 | 100 | 13 | O | 3.5 |

Notes: Unit of Mo—Mn and SiO$_2$ is wt %. Electrical resistance of the metallized layer, thickness of the intermediate layer, and peeling strength are indicated in mΩ/□, μm, and kgf/mm$^2$, respectively.

Example 4

In this example samples were made by a method similar to that in Example 1 except coating of a planar AlN substrate with paste-like components of the metallized layer shown in Table 4, of about 20 μm thickness. Here in Mo—Mn component of the metallized layer in Table 4, weight ratio of Mo:Mn is 8:1 and the ratio of Mn—Mn, Mo, W, and the active component is indicated in wt %.

Thickness of the intermediate layer (μm), heat-resistant test, and peeling strength (kgf/mm$^2$) of said sample were measured by methods similar to those employed in Example 1. The results of the measurements are shown in Table 4.

What follows has turned out from Table 4.

(6) Components of the metallized layer containing at least one selected from Mg, Ca, Sr, Ba, Y, V, Ti, Zr, Cr, Nb, Mo, Mn, B, Al, Si, La, Hf and Ta, and oxides the nitrides of these elements, at least one of which is oxide, as in the sample Nos. D-1 to 24, results in surface structure having excellent heat resistance and peeling strength.

Example 5

In this example samples were made by a method similar to that in Example 1 except coating of a planar AlN substrate having an average particle size of 10 μm and surface roughness shown in Table 5 with paste-like components of the metallized layer of about 20 μm thickness containing 80 wt % Mo, 10 wt % Mn, and 10 wt % SiO$_2$.

Heat resistant test and peeling strength (kgf/mm$^2$) of said sample were measured by methods similar to those employed in Example 1. The results of the measurements are shown in Table 5.

TABLE 5

| Sample No. | Surface roughness | Heat-resistant test | Peeling strength |
| --- | --- | --- | --- |
| E-1 | 0.1 | O | 2.3 |
| E-2 | 0.4 | O | 2.1 |
| E-3 | 0.7 | O | 1.8 |
| E-4 | 1.5 | O | 1.5 |
| E-5 | 2.0 | X | 0.3 |

Notes: Surface roughness and peeling strength are indicated in μm Ra and kgf/mm$^2$, respectively.

What follows has become clear from Table 5.

(7) Surface roughness of the AlN substrate no more than 1.5 μmRa causes stronger bonding between the metallized layer and the AlN substrate resulting in excellent heat resistance and peeling strength, as is shown by sample Nos. E-1 to 4.

Example 6

In this example samples were made by a method similar to that in Example 1 except heat treating under air at temperatures shown in Table 6 for one hour followed by sintering at a temperature of 1300° C. under decomposed ammonia gas having a dew point of −20° C.

Thickness of the intermediate layer (μm), components forming the intermediate layer, heat-resistant test,

TABLE 4

| Sample No. | Components of the metallized layer | | | Intermediate layer Thickness | Heat-resistant test | Peeling strength |
| --- | --- | --- | --- | --- | --- | --- |
| | Mo—Mn (wt %) | Active Component | Amount of addition (wt %) | | | |
| D-1 | 90 | MgO | 10 | 6 | O | 1.9 |
| D-2 | 90 | Al$_2$O$_3$ | 10 | 4 | O | 1.7 |
| D-3 | 90 | SiO$_2$ | 10 | 5 | O | 1.8 |
| D-4 | 90 | CaO | 10 | 7 | O | 2.0 |
| D-5 | 90 | TiO$_2$ | 10 | 5 | O | 1.7 |
| D-6 | 90 | V$_2$O$_5$ | 10 | 4 | O | 1.8 |
| D-7 | 90 | Cr$_2$O$_3$ | 10 | 3 | O | 1.5 |
| D-8 | 90 | MnO | 10 | 6 | O | 2.1 |
| D-9 | 90 | SrO | 10 | 4 | O | 1.8 |
| D-10 | 90 | Y$_2$O$_3$ | 10 | 4 | O | 1.9 |
| D-11 | 90 | ZrO$_2$ | 10 | 3 | O | 1.5 |
| D-12 | 90 | Nb$_2$O$_5$ | 10 | 6 | O | 2.0 |
| D-13 | 90 | MoO$_3$ | 10 | 5 | O | 1.8 |
| D-14 | 90 | BaO | 10 | 4 | O | 1.9 |
| D-15 | 90 | HfO$_2$ | 10 | 3 | O | 1.5 |
| D-16 | 90 | Ta$_2$O$_5$ | 10 | 5 | O | 1.9 |
| D-17 | 90 | B$_2$O$_3$/AlN | 5/5 | 4 | O | 1.5 |
| D-18 | 90 | La$_2$O$_3$/Al$_2$O$_3$ | 5/5 | 5 | O | 1.6 |
| D-19 | 90 | SiO$_2$/Si$_3$N$_4$ | 5/5 | 7 | O | 2.2 |
| D-20 | 90 | Y$_2$O$_3$/Al | 5/5 | 6 | O | 1.9 |
| D-21 | 90 | AlN/SiO$_2$ | 5/5 | 4 | O | 1.9 |
| D-22 | 90 | TiN/Al$_2$O$_3$ | 5/5 | 5 | O | 2.0 |
| D-23 | Mo 90 | SiO$_2$ | 10 | 4 | O | 1.7 |
| D-24 | W 90 | SiO$_2$ | 10 | 2 | O | 1.4 |

Notes:
Unit of amount of addition of Mo—Mn and active component is wt %.
Thickness of the intermediate layer and peeling strength are indicated in μm and kgf/mm$^2$, respectively.

and peeling strength (kgf/mm²) of said sample were measured by methods similar to those employed in Example 1. The results of the measurements are shown in Table 6.

What follows has become clear from Table 5.

TABLE 6

| Sample No. | Temperature | Intermediate layer Thickness | Intermediate layer Component | Heat-resistant test | Peeling strength |
|---|---|---|---|---|---|
| F-1 | 100 | <1 | Al, Si, O, Mn, N | X | 0.7 |
| F-2 | 200 | 3 | Al, Si, O, Mn, N | O | 1.5 |
| F-3 | 300 | 5 | Al, Si, O, Mn, N | O | 1.8 |
| F-4 | 400 | 6 | Al, Si, O, Mn, N | O | 1.7 |
| F-5 | 500 | 8 | Al, Si, O, Mn, N | O | 1.5 |
| F-6 | 600 | 9 | Al, Si, O, Mn | X | 0.5 |

Notes: Temperature, thickness of the intermediate layer, and peeling strength are indicated in °C., μm, and kgf/mm², respectively.

(8) Heat treating temperature lower than 200° C. under an oxidizing atmosphere as in the sample Nos. F-1 causes insufficient reaction between the metallized layer and the AlN substrate resulting in thickness of the intermediate layer less than 1 μm and, hence, inferior heat resistance and peeling strength.

(9) Heat treating temperature higher than 500° C. under an oxidizing atmosphere as in the sample Nos. F-6 causes oxidation of the metallized layer and making the components of the intermediate layer, formed between the metallized layer and the AlN substrate, only oxides. This results in inferior heat resistance and peeling strength.

That is, as is understood from items (1)–(9) in the above, the intermediate layer should contain, at least, aluminum, nitrogen, and oxygen for the surface structure of the AlN substrate to have excellent thermal conductivity and elctric characteristics.

In order to make such surface structure of the AlN substrate, the AlN substrate coated with components of the metallized layer should be sintered by two stages of heat treating, namely, those at a temperature of 200°–500° C. under an oxidizing atmosphere and at a temperature of 1200°–1400° C. under a nonoxidizing atmosphere having a dew point of −35° to 5° C.

It should be understood that modifications may be made in the art without departing from the gist and scope of the present invention as disclosed herein and claimed hereinbelow.

What is claimed is:

1. A surface structure for an AlN substrate comprising: an AlN substrate,
   an intermediate layer disposed on the AlN substrate, and
   a metallized layer disposed on said intermediate layer, said intermediate layer comprising at least aluminum, nitrogen and oxygen.

2. The surface structure as defined in claim 1, wherein said metallized layer has a main component selected from the group consisting of Mo—Mn alloy, Mo and W.

3. The surface structure as defined in claim 1 wherein said intermediate layer has a thickness of 1–20 μm.

4. The surface structure as defined in claim 3, wherein said metallizing layer components further contain at least one selected from the group consisting of: Mg, Ca, Sr, Ba, Y, Ti, Zr, V, Cr, Nb, Mo, Mn, B, Al, Si, La, Hf and Ta; and oxides and nitrides thereof, provided that oxide must be present therein.

5. The surface structure as defined in claim 1, wherein at least 40% by weight Al, at least 1% by weight N and at least 0.1% by weight oxygen are present in said intermediate layer.

6. The surface structure as defined in claim 5, wherein Al is 50–70% by weight, N is 10–30% by weight and oxygen is 1–30% by weight.

7. The surface structure as defined in claim 1, wherein said main component of the metallized layer amounts to at least 70% by weight.

8. The surface structure as defined in claim 7, wherein said metallized layer further comprises at least one additional component selected from the group consisting of Mg, Ca, Sr, Ba, Y, Ti, Zr, V, Cr, Nb, Mo, Mn, B, Al, Si, La, Hf, Ta, and oxides and nitrides of these elements provided that one of said additional components is oxide.

9. The surface structure as defined in claim 8, wherein said additional component amounts to 3–30% by weight of the metallized layer, provided that the oxide amounts to at least 3% by weight.

10. The surface structure defined in claim 2, wherein said intermediate layer has a thickness of 1–20 μm.

* * * * *